United States Patent
Liao

[11] Patent Number: 6,001,716
[45] Date of Patent: Dec. 14, 1999

[54] FABRICATING METHOD OF A METAL GATE

[75] Inventor: Kuan-Yang Liao, Taipei, Taiwan

[73] Assignee: United Silicon Incorporated, Taipei, Taiwan

[21] Appl. No.: 09/121,154

[22] Filed: Jul. 22, 1998

[30] Foreign Application Priority Data

May 22, 1998 [TW] Taiwan .................................. 87107996

[51] Int. Cl.⁶ .................................................. H01L 21/441
[52] U.S. Cl. ............................................ 438/585; 438/605
[58] Field of Search ..................................... 438/573, 582, 438/586, 593, 605, 653, 656, 669, 585

[56] References Cited

U.S. PATENT DOCUMENTS 5,877,087   2/1999   Mosely et al. .

OTHER PUBLICATIONS

Kim et al., Tungsten Silicide/Titanium compound gate for submicron cmosfet, IEEE, pp. 115–116, 1990.
Wakabayashi et al., Highly reliable W/TiN/pn–poly–Si Gate CMOS . . . , IEEE, pp. 447–450, 1996.
Lee et al., Characteristics of CMOSFETswith sputter–deposited W/TiN stack gate. VLSI Tech dig., p. 11, 1995.
Yang et al., A comparison of TiN Processes for CVD W/TiN gate electrode on 3nm Gate Oxide, IEEE, pp. 459–462, Dec. 7, 1997.
Hu et al., Feasibility of Using W/TiN as a Metal Gate for Conventional .13um CMOS Tech. and Beyond, IEEE, pp. 825–828, Jul. 1997.

*Primary Examiner*—Charles Bowers
*Assistant Examiner*—Scott J. Hawranek
*Attorney, Agent, or Firm*—Thomas, Kayden, Horstemeyer & Risley

[57] ABSTRACT

A method of fabricating a metal gate includes forming a gate insulating layer on a provided substrate, forming a PVD titanium nitride layer on the gate insulating layer, forming a CVD titanium nitride layer on the PVD titanium nitride layer, and forming a CVD tungsten layer on the CVD titanium nitride layer. The CVD tungsten layer, the CVD titanium nitride layer, and the PVD titanium nitride layer are later patterned to form the metal gate.

3 Claims, 1 Drawing Sheet

FABRICATING METHOD OF A METAL GATE

CROSS-REFERENCE TO RELATED APPLICATION

This application claims the priority benefit of Taiwan application serial no. 87107996, filed May 22, 1998, the full disclosure of which is incorporated herein by reference.

BACKGROUND OF THE INVENTION

1. Field of the Invention

This invention relates to a fabricating method for a gate in a metal-oxide-semiconductor (MOS) transistor, and more particularly, to a fabricating method for a metal gate in a MOS transistor.

2. Description of Related Art

A MOS device includes stacked metal layers, oxide layers, and semiconductor layers wherein the metal layers mostly include aluminum, the oxide layers chiefly include silicon oxide, and the semiconductor layers mainly include silicon wafers. Because of the low melting point of aluminum, polysilicon, which is more similar to silicon, is used as a conducting material in a modern MOS device. As shown in FIG. 1, a polysilicon layer 102 working as a conducting layer has a contact with an oxide layer 104 over a silicon substrate 100, wherein the polysilicon layer 102 is further doped in order to increase its conductivity. A MOS device, as shown in FIG. 1, further includes source/drain regions 106 on either side of the polysilicon layer in the substrate 100.

As the design rule of a semiconductor device moves toward the sub-micron level, the thickness of the oxide layer under the gate of a MOS transistor is accordingly and necessarily reduced. In this case, the design of a conventional PMOS device no longer meets requirements, and is replaced by a PMOS design with a surface channel. The polysilicon gate in a MOS device having a PMOS with a surface channel is also changed from N-type used in a conventional design to a P-type, wherein the P-type polysilicon gate is normally formed by implanting boron ions into a polysilicon gate. Since the implanted boron ions tend to diffuse into the silicon substrate through the oxide layer located between the polysilicon gate and the substrate, and cause the instability of the threshold voltage of a MOS device, a metal gate is considered for use in a MOS device of a line width under 0.25 µm.

Tungsten, which has a high melting point, is often used to form a metal gate. The gate can be formed by chemical vapor deposition (CVD) or physical vapor deposition (PVD), wherein the CVD-tungsten is a preferred material for a metal gate. Because fluorine ions within the $WF_6$ vapor used in the process forming a tungsten layer by CVD cause impurities in the gate oxide, a titanium nitride layer has to be formed on the gate oxide before performing CVD.

As shown in FIG. 2, a titanium nitride layer 204 is formed on gate oxide 202, which is formed on a substrate 200, through CVD. Then, a CVD-tungsten layer 206 is formed on the titanium nitride layer 204, wherein the tungsten layer 206 and the titanium nitride layer 204 are later patterned to form a metal gate. Referring to FIG. 3, similarly, a titanium nitride layer 304 is formed on gate oxide 302, which is formed on a substrate 300, through PVD. Then, a CVD-tungsten layer 306 is formed on the titanium nitride layer 304, wherein the tungsten layer 306 and the titanium nitride layer 304 are later patterned to form a metal gate.

In the foregoing even though a titanium nitride layer 204 formed by CVD is capable of preventing the diffusion of the fluorine ions, the impurities within the titanium nitride layer 204 still cause the the gate oxide 202 to contain impurities in the follow-up processes. On the other hand the titanium nitride layer 304 formed by PVD, a columnar crystal structure, which is capable of making excellent contact with the gate oxide 302, is still unable to prevent the fluorine ions from diffusing into the gate oxide 302.

SUMMARY OF THE INVENTION

It is therefore an objective of the present invention to provide a fabricating method for a metal gate that combines the advantage of a CVD titanium nitride layer, excellent prevention on the diffusion of fluorine ions, and the advantage of a PVD titanium nitride layer excellent contact with gate oxide.

In accordance with the foregoing and other objectives of the present invention, the invention provides a method of fabricating a metal gate in a MOS device. The method includes forming a titanium nitride layer on a gate oxide of a semiconductor substrate through PVD, forming another titanium nitride layer through CVD on the PVD titanium nitride layer, and forming a tungsten layer on the CVD silicon nitride layer through CVD. The CVD tungsten layer, the CVD titanium nitride layer, and the PVD titanium nitride layer are later patterned to from a metal gate.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new fabricating method of metal gate in a MOS device.

Because the thickness of the gate oxide is reduced due to the downsizing of the design line width, a metal gate, which has a higher conductivity, is increasingly used in CMOS design to replace a polysilicon gate to overcome the gate depletion problem.

Figure 1:
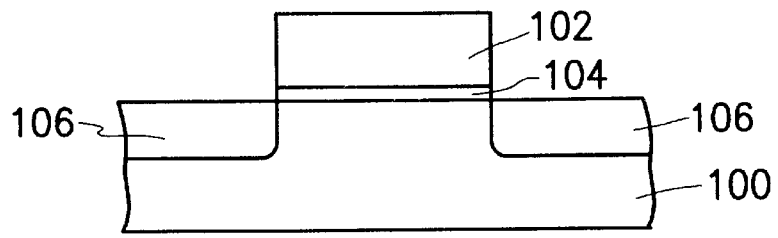
FIG. 1 is a cross-sectional view showing a conventional polysilicon gate in a MOS device.
Figure 2:
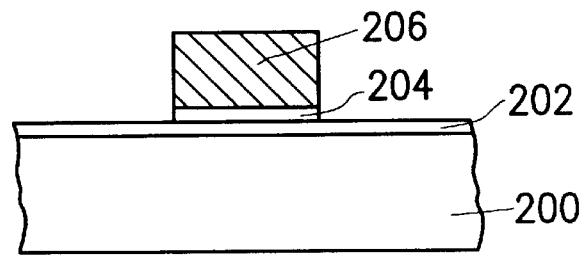
FIG. 2 is a cross-sectional view showing a conventional metal gate in a MOS device.
Figure 3:
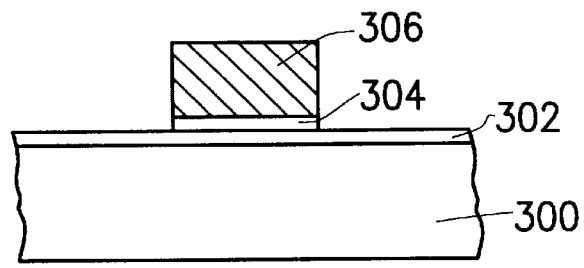
FIG. 3 is a cross-sectional view showing another conventional metal gate in a MOS device.
Figure 4:
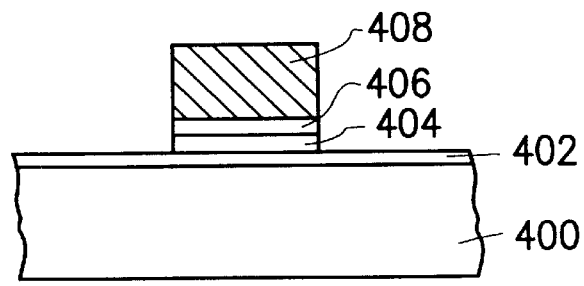
FIG. 4 is a cross-sectional view showing the metal gate in a MOS device in a preferred embodiment according to the invention.

FIG. 4 is a cross-sectional view showing the metal gate according to a preferred embodiment of the invention.

As shown in FIG. 4, a titanium nitride layer 404 is formed through PVD, on a gate insulating layer 402 over a substrate 400, wherein the gate insulating layer 402 includes oxide. Another titanium nitride layer 406 is formed on the PVD titanium nitride layer 404 through CVD. A tungsten layer 408 is then deposited on the CVD titanium nitride layer 406 through a process, which includes CVD. Generally, a CVD tungsten layer has better conformability and lower density of defects over a PVD tungsten layer, but the fluorine impurities within the CVD tungsten layer bring down the gate oxide integrity (GOI) of the gate insulating layer 402.

The differences in the formations of the PVD titanium nitride layer 404 and the CVD titanium nitride layer 406 are different, which leads to different physical properties. These two titanium nitride layers, 404 and 406, have different functions in a metal gate 408. The PVD titanium nitride layer 404, a columnar crystal, has excellent contact with gate oxide 402. The PVD titanium nitride layer 404 further has a better intrinsic property, making it a preferable material for a gate. However, the PVD titanium nitride layer 404 cannot prevent fluorine ions from diffusing into the gate-insulating layer 402 during the formation of the tungsten layer 408. Therefore, a CVD titanium nitride layer 406, an amorphous film, is formed on the PVD titanium nitride layer 404 to absorb fluorine ions for preventing them from diffusing into the gate insulating layer 402. The impurities within the CVD titanium nitride layer 406 are blocked from diffusing into the gate insulating layer 402 by the presence of the PVD titanium nitride layer 404.

Hence, forming a PVD titanium nitride layer 404 on a gate insulating layer 402 and then a CVD titanium nitride layer 406 thereon provides a better contact between the gate insulating layer 402 and the gate, and further maintains the GOI of the gate insulating layer 402.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating a metal gate, the method comprising:

providing a substrate;

forming a gate-insulating layer on the substrate;

forming a PVD titanium nitride layer on the gate-insulating layer;

forming a CVD titanium nitride layer on the PVD titanium nitride layer;

forming a metal layer on the CVD titanium nitride layer; and patterning the metal layer, the CVD titanium nitride layer, and the PVD titanium nitride layer to form the metal gate.

2. The method of claim 1, wherein the step of forming the metal layer includes depositing a tungsten layer through chemical vapor deposition.

3. A method of fabricating a metal gate, the method comprising:

providing a substrate;

forming a gate-insulating layer on the substrate;

forming a PVD titanium nitride layer on the gate-insulating layer;

forming a CVD titanium nitride layer on the PVD titanium nitride layer;

forming a CVD tungsten layer on the CVD titanium nitride layer; and patterning the CVD tungsten layer, the CVD titanium nitride layer, and the PVD titanium nitride layer to form the metal gate.

* * * * *